United States Patent
Chinnakkonda Vidyapoornachary et al.

(10) Patent No.: US 10,884,055 B2
(45) Date of Patent: *Jan. 5, 2021

(54) LEAKAGE POWER CHARACTERIZATION AT HIGH TEMPERATURES FOR AN INTEGRATED CIRCUIT

(71) Applicant: INTERNATIONAL BUSINESS MACHINES CORPORATION, Armonk, NY (US)

(72) Inventors: Diyanesh B. Chinnakkonda Vidyapoornachary, Bangalore (IN); Anand Haridass, Bangalore (IN); Arun Joseph, Bangalore (IN); Charles R. Lefurgy, Austin, TX (US); Spandana V. Rachamalla, Bangalore (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 173 days.

This patent is subject to a terminal disclaimer.

(21) Appl. No.: 15/989,743

(22) Filed: May 25, 2018

(65) Prior Publication Data

US 2018/0372797 A1  Dec. 27, 2018

Related U.S. Application Data

(63) Continuation of application No. 14/806,155, filed on Jul. 22, 2015, now Pat. No. 10,031,180.

(51) Int. Cl.
*G01R 31/30* (2006.01)
*G01R 31/28* (2006.01)

(52) U.S. Cl.
CPC ..... *G01R 31/3008* (2013.01); *G01R 31/2874* (2013.01)

(58) Field of Classification Search
CPC .................. G01R 31/3008; G01R 31/2874
See application file for complete search history.

(56) References Cited

U.S. PATENT DOCUMENTS 5,600,578 A   2/1997  Fang et al.
6,809,538 B1  10/2004 Borkar
(Continued)

OTHER PUBLICATIONS

Huang et al., Leakage Temperature Dependency Modeling in System Level Analysis, 11th Int'l Symposium on Quality Electronic Design, 2010 (Year: 2010).*

(Continued)

*Primary Examiner* — Daniel R Miller
(74) *Attorney, Agent, or Firm* — Erik Johnson; Andrew M. Calderon; Roberts Calderon Safran & Cole, P.C.

(57) ABSTRACT

A system for post-silicon leakage characterization is configured to apply a rail voltage to a hardware component; cause the hardware component to operate at a particular frequency; cause a cooling device, coupled to the hardware component, to operate at a cooling capacity; run a workload on the hardware component after applying the rail voltage, causing the hardware component to operate at a particular frequency, and causing the cooling device to operate at a particular cooling capacity; discontinue the workload and clocks of the hardware component after a temperature of the hardware component has reached a steady high point; continuously measure temperature and leakage power of the hardware component after discontinuing the workload until the temperature of the hardware component has reached a steady low point; and adjust a power management procedure for the hardware component based on measured temperature and measured leakage power of the hardware component.

20 Claims, 5 Drawing Sheets

(56) References Cited

U.S. PATENT DOCUMENTS

| | | | |
|---|---|---|---|
| 7,383,149 B1 | 6/2008 | Walker | |
| 7,814,339 B2 | 10/2010 | Monferrer et al. | |
| 8,214,777 B2 | 7/2012 | Joshi et al. | |
| 8,555,236 B2 | 10/2013 | Potkonjak | |
| 2003/0074173 A1* | 4/2003 | Monroe | G01R 31/3183 703/13 |
| 2007/0001694 A1* | 1/2007 | Jahagirdar | G01R 31/2891 324/750.3 |
| 2010/0274505 A1 | 10/2010 | Ituero Herrero et al. | |
| 2013/0097609 A1* | 4/2013 | Li | G06F 1/329 718/104 |
| 2013/0328846 A1 | 12/2013 | Jamal et al. | |
| 2015/0198660 A1 | 7/2015 | Dhanwada et al. | |
| 2016/0054422 A1 | 2/2016 | Nemani | |
| 2017/0023639 A1 | 1/2017 | Chinnakkonda Vidyapoornachary et al. | |

OTHER PUBLICATIONS

Wei Huang et al., "TAPO: Thermal-Aware Power Optimization Techniques for Servers and Data Centers". IEEE, 2011, 8 pages.
List of IBM Patents or Patent Applications Treated as Related 1 page.

\* cited by examiner

LEAKAGE POWER CHARACTERIZATION AT HIGH TEMPERATURES FOR AN INTEGRATED CIRCUIT

FIELD OF THE INVENTION

The invention relates to semiconductor systems and, more particularly, to post-silicon leakage power characterization for an integrated circuit.

BACKGROUND

Post-silicon validation and debugging is a final process in the development of a semiconductor device in which bugs and other defects are detected in an integrated circuit after manufacture. Accurate post-silicon leakage power modeling requires power measurement across a wide range of temperature conditions. Obtaining power measurements at relatively high temperatures can be expensive and time consuming.

Poor leakage power models may cause margining and loss of opportunity in run-time power management algorithms, e.g., power capping, energy savings, etc. Leakage power is strongly non-linear with temperature, voltage, and process. Therefore, attempting to interpolate leakage power measurements at higher temperatures can lead to inaccurate leakage power models. Errors in models may be worse at slow process corners and higher voltages.

Inaccurate leakage power models can lead to overly optimistic power management policies in which operating frequency of a hardware component, e.g., a processor, is set too high, which can overload and/or overheat the processor and waste energy. On the other hand, inaccurate leakage power models can lead to overly pessimistic power management policies in which operating frequency of the processor is set too low, thereby reducing performance.

Testers can be used to obtain leakage power measurements for individual components in a system. However, testers are relatively expensive. Also, using testers can be time consuming for volume testing.

SUMMARY

In an aspect of the invention, a method includes setting a rail voltage, a frequency, and a cooling capacity of a cooling device for a hardware component; running a workload on the hardware component after setting the rail voltage, the frequency, and the cooling capacity; discontinuing the workload and clocks of the hardware component after a temperature of the hardware component has reached a steady high point; continuously measuring temperature and leakage power of the hardware component after discontinuing the workload and the clocks until the temperature of the hardware component has reached a steady low point; modeling, by a computing device, leakage power for the hardware component based on the temperature and leakage power measurements; and outputting, by the computing device, data relating to the temperature and leakage power measurements to an erasable programmable read only memory (EPROM).

In an aspect of the invention, a method includes preheating a hardware component until a temperature of the hardware component reaches a steady high point; discontinuing preheating the hardware component has reached the steady high point; obtaining temperature and the leakage power measurements by continuously measuring temperature and leakage power of the hardware component after discontinuing the preheating until the temperature of the hardware component has reached a steady low point; modeling, by a computing device, leakage power for the hardware component based on the temperature and leakage power measurements; and outputting, by the computing device, data relating to the temperature and leakage power measurements to an erasable programmable read only memory (EPROM).

In an aspect of the invention, a system is configured to apply a rail voltage to a hardware component; cause the hardware component to operate at a particular frequency; cause a cooling device, coupled to the hardware component, to operate at a particular cooling capacity; run a workload on the hardware component after applying the rail voltage, causing the hardware component to operate at a particular frequency, and causing the cooling device to operate at a particular cooling capacity; discontinue the workload and clocks of the hardware component after a temperature of the hardware component has reached a steady high point; continuously measure temperature and leakage power of the hardware component after discontinuing the workload until the temperature of the hardware component has reached a steady low point; and adjust a power management procedure for the hardware component based on measured temperature and measured leakage power of the hardware component.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION

Figure 1:
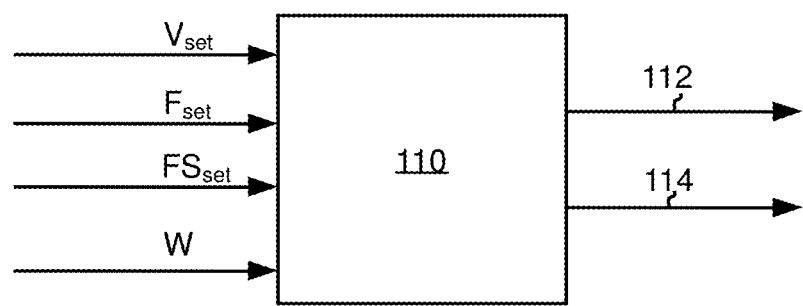
FIG. 1 shows an overview of an implementation for obtaining post-silicon leakage power data for leakage power modeling and characterization in accordance with aspects of the present invention.

The invention relates to semiconductor systems and, more particularly, to post silicon leakage power characterization in a system. More specifically, the present invention relates to post silicon leakage power characterization at relatively high temperatures in a system.

Accurate post-silicon leakage power modeling and characterization is vital for optimizing power management algorithms, e.g., power capping, energy savings, etc. In accordance with aspects of the present invention, leakage power data can be obtained by testing components in a system environment, which can be substantially less expensive since systems are more readily available than testers. Moreover, modeling post-silicon leakage power in a system environment is desirable so that post-silicon leakage power of the entire system can be characterized. Further, post-silicon leakage power data may be obtained at relatively high temperatures in a system environment, which eliminates the need for interpolating results, thus leading to more accurate modeling.

In accordance with aspects of the present invention, leakage power data for a hardware component, e.g., a processor, can be obtained in two phases. In phase 1, e.g., a preheating phase, the hardware component is preheated by first enabling a power characterization mode of the hardware component, thereby disabling power management features, such as power gating. Rail voltage for the hardware component, $V_{set}$, operating frequency for hardware component, $F_{set}$, and a fan speed for a fan coupled to the hardware component, $FS_{set}$ are then set. A range of temperatures for the hardware component is based on the combination of $V_{set}$, $F_{set}$, and $FS_{set}$. A constant high-powered workload W is run in a loop, e.g., on one or more cores in the hardware component. The workload W is designed such that the temperature profile across the chip is as uniform as possible. The workload W is run until the temperature of the hardware component settles at a steady high point $T_{high}$. In embodiments, the temperature $T_{high}$ may be substantially higher than at idle operating conditions so that leakage power data can be gathered at these higher temperatures.

Once $T_{high}$ has been reached, phase 2 begins by shutting off the workload in all cores of the hardware components. Further, all clocks in the hardware component are also shut off. This ensures that all non-leakage power components are zero. At this stage, the hardware component temperature begins to drop since the dynamic power components are zero. The rate of the temperature drop (Mt) may be controlled by the fan speed $FS_{set}$. As the hardware component temperature drops, leakage power and the temperature is continuously measured at a particular sampling rate (St) in which the analog sensors are configured to measure the data until the temperature settles to a steady low point or a minimum point of interest, $T_{low}$. The rate of temperature drop Mt may be controlled by the fan speed $FS_{set}$, and may be adjusted so that Mt is less than St. Phase 1 can be repeated to adjust $V_{set}$, $F_{set}$, and $FS_{set}$ in order to achieve a different range of temperatures. Phase 2 can then be repeated to measure leakage power at the different range of temperatures.

By way of non-limiting illustrative example, fan speed is adjusted to control the rate of temperature drop, and to obtain higher temperatures of $T_{high}$, and lower temperatures of $T_{low}$. In embodiments, other types of cooling systems, including or excluding a fan, may be used. For example, in a system having a water cooling device, the cooling capacity of the water cooling device can be set to adjust the rate of temperature drop, and to obtain higher temperatures of $T_{high}$, and lower temperatures of $T_{low}$. For example, the temperature of the water can be adjusted, or the rate at which water flows through the water cooling device can be adjusted.

Since all clocks are off, temperature measurements are obtained using analog thermal sensors on the hardware component. In an embodiment in which the hardware component does not include analog thermal sensors and only includes digital thermal sensors, or for hardware components that do not support efficient cut off of all clock frequencies, the clock frequency may be set to the lowest value needed for the digital thermal sensor to operate. Since the clock is running, a relatively small amount of idle clock power may be present. In such cases, the frequency dependent idle clock power is subtracted from the total idle power to get the frequency independent leakage power.

FIG. 1 shows an overview of an implementation for obtaining post-silicon leakage power data for leakage power modeling and characterization in accordance with aspects of the present invention. In FIG. 1, leakage power data may be obtained for hardware component 110, such as a post-silicon processor chip and/or other type of semiconductor or integrated circuit. For example, hardware component 110 may be preheated by setting a rail voltage to a constant voltage set point $V_{set}$, setting a frequency to a constant value $F_{set}$, and setting a speed of a fan coupled to hardware component 110 to a constant value, e.g., speed $FS_{set}$. Further, a workload W may be applied to hardware component 110. For example, the workload W may be a constant high-powered workload, e.g., a performance testing workload model, such as a benchmark test, a hardware load test, or the like. The workload W may be applied to all cores in hardware component 110, and may be such that, when running workload W, the temperature profile across hardware component 110 is as uniform as possible. The workload W may be run until the temperature of hardware component 110 reaches a relatively constant level of $T_{high}$.

Once hardware component 110 has been preheated to a temperature of $T_{high}$, the workload W and the clocks of hardware component 110 are shut off in all of the cores. Further, all clocks are shut off in hardware component 110 so as to eliminate the presence of idle clock power in hardware component 110. As a result of shutting off workload W and the clocks of hardware component 110 (global), the temperature of hardware component 110 gradually begins to drop and settle at a temperature of $T_{low}$. As the temperature drops, leakage power measurements 112 and temperature measurements 114 may be gathered, e.g., by analog thermal sensors coupled to the hardware component (since digital sensors will not function when clocks are shut off). A dataset of hardware leakage power measurements at various temperature measurements may be stored, and this dataset may be used to characterize and model leakage power for hardware component 110. In embodiments, the dataset may include a table that identifies the leakage current and/or leakage power at a particular temperature and at a particular time instance.

As described herein, $V_{set}$, $F_{set}$, and/or $FS_{set}$ may be varied in order to achieve higher values of $T_{high}$ and lower values of $T_{low}$ so that leakage power measurements may be obtained for a wide range of temperatures. By way of non-limiting example, leakage power measurements may be obtained for temperatures ranging from approximately 55° Celsius (C) to approximately 95° C., although this temperature range can be varied for different embodiments. In embodiments, more leakage power data will more accurately characterize the post-silicon leakage power behavior for hardware component 110. This data may then be output to an erasable programmable read only memory (EPROM), which may use the data to modify a power management policy or power management procedure, implemented by a service processor, for hardware component 110.

By implementing the processes of the present invention, the power management policy may be based on more accurate leakage power data to optimize power management algorithms, e.g., power capping, energy savings, etc. for hardware component 110. For example, the power management policy may be adjusted such that hardware component 110 is not overloaded, but also such that the performance of hardware component 110 is optimized, e.g., an operating frequency of hardware component 110 can be set to the highest point without overloading hardware component 110. Also, power gating features and/or management policies may be adjusted to be either more aggressive or more conservative based on the leakage power characterization measurements and data. For example, if the leakage power data shows relatively high amounts of leakage power at certain temperatures, the power management policy may be adjusted to prevent the chances of hardware component 110 reaching those temperatures. In embodiments, leakage power driven fan speed control algorithms may also be refined.

Figure 2:
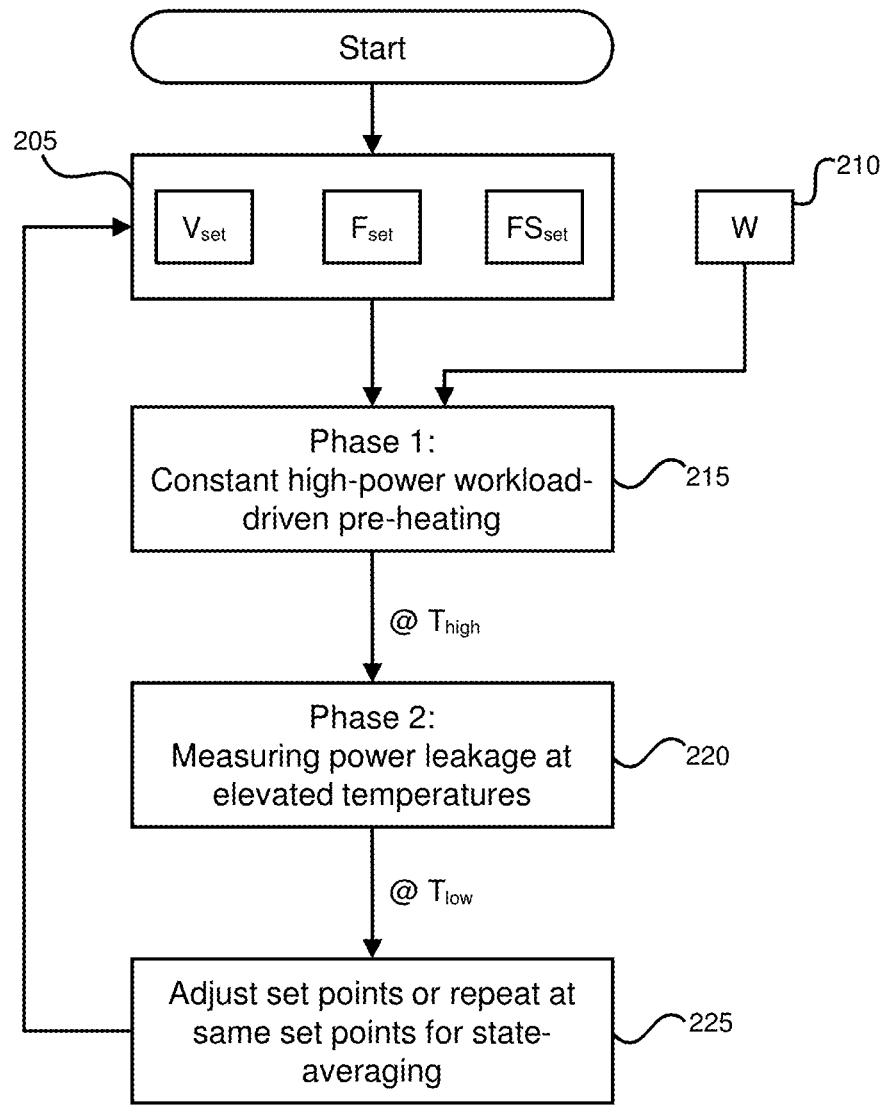
FIG. 2 is a flowchart for obtaining leakage power measurements for a hardware component at various temperatures in accordance with aspects of the present invention.
Figure 3:
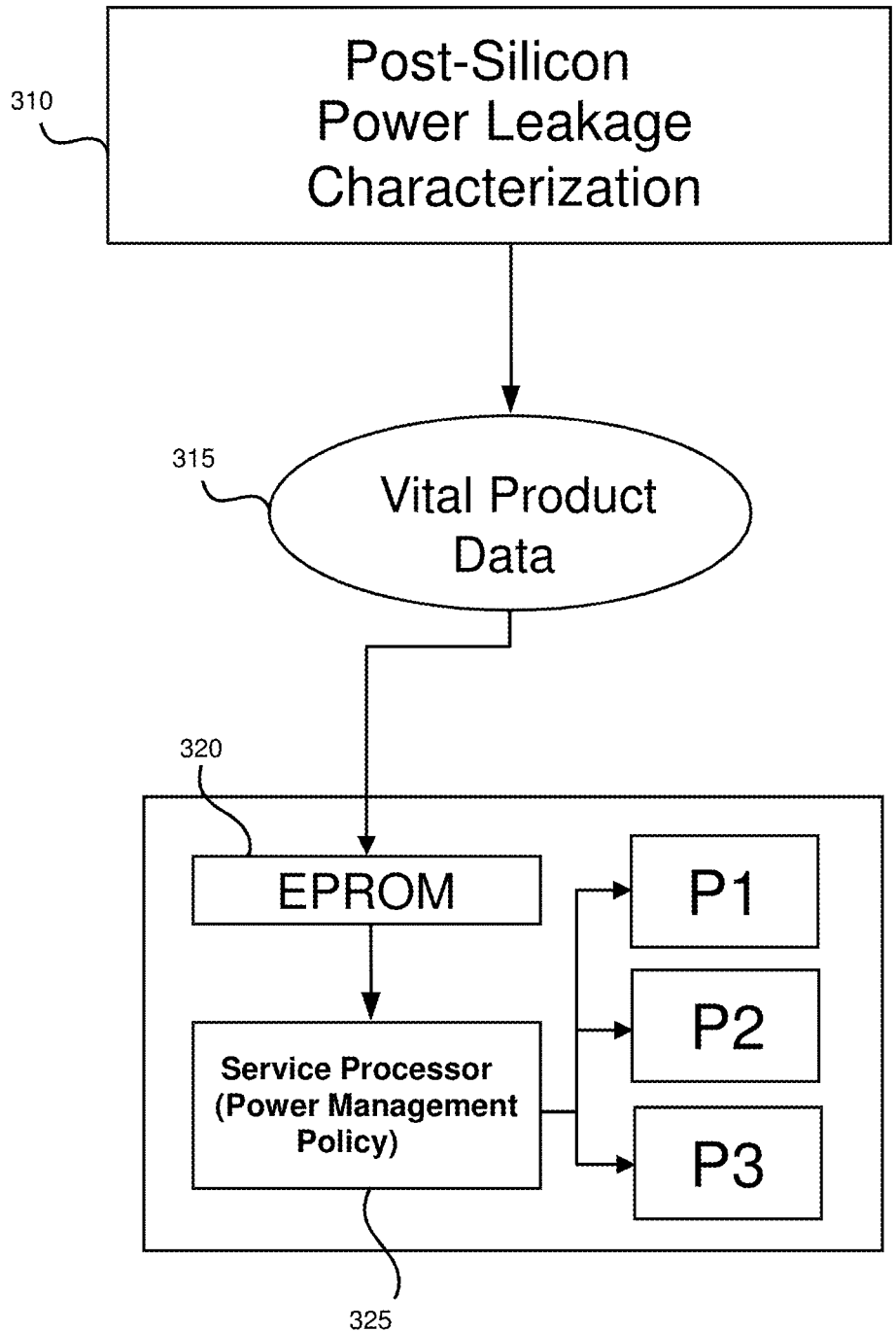
FIG. 3 shows a block diagram for using leakage power characterization data for system level power and performance management in accordance with aspects of the present invention.

FIGS. 2 and 3 show a flowchart and block diagram, respectively, of processes and systems in accordance with aspects of the present invention. The flowchart and block diagram of FIGS. 2 and 3 illustrate the architecture, functionality, and operation of possible implementations of systems, methods, and computer program products according to various embodiments of the present invention. In this regard, each block may represent a module, segment, or portion of instructions, which comprises one or more executable instructions for implementing the specified logical function(s).

It will also be noted that the processes described herein or any combinations thereof can be implemented by special purpose hardware-based systems that perform the specified functions or acts or carry out combinations of special purpose hardware and computer instructions. The process described herein can be implemented as a computer program product which may include a computer readable storage medium (or media) having computer readable program instructions thereon for causing a processor to carry out aspects of the invention. The computer readable storage medium is any physical storage medium or device and should not be interpreted as a non-transient signal, per se.

FIG. 2 is a flowchart for obtaining leakage power measurements for a hardware component at various temperatures. At step 205, for a particular hardware component, such as a processor, a rail voltage is set to a constant voltage set point value $V_{set}$, a frequency is set to a constant value $F_{set}$, and a speed of a fan coupled to the hardware component is set to a constant speed of $FS_{set}$. For example, an operator may set $V_{set}$, $F_{set}$, and $FS_{set}$ on the hardware component using a control device or interface of the hardware component. As described above, other cooling devices can be used instead of, or in addition to, a fan. If a cooling device, in addition to or instead of a fan is coupled to the hardware device, the cooling capacity of the cooling device can be set. For example, assuming that a water cooling device is coupled to the hardware component, a temperature of the water may be set instead of setting a fan speed. At step 210, a workload W is run on the hardware component. In embodiments, the workload W can be run on all cores of the hardware component, or only on selected cores. For example, the operator can instruct the hardware component to run the workload W. In embodiments, setting the rail voltage, the frequency, the fan speed, and running the workload W initiates phase 1 of a leakage power measurement process for the hardware component, e.g., a constant high-powered workload-driven pre-heating phase, at step 215. The workload W may be continuously run in a loop until a temperature of the hardware component reaches a steady high point $T_{high}$. In embodiments, the workload W may be run in one or more cores of the hardware component. In embodiments, the temperature $T_{high}$ may be substantially higher than at idle operating conditions so that leakage power data can be gathered at these higher temperatures. The value of $T_{high}$ is based on the combination of $V_{set}$, $F_{set}$, and $FS_{set}$. In embodiments, power management features, such as power gating, may be disabled so as to not interfere with the leakage power data.

At step 220, phase 2 of the leakage power measurement process for the hardware component, e.g., a measuring leakage power at elevated temperatures phase, may begin by shutting off, e.g., discontinuing, the workload W and disabling all clocks on the hardware component. The clocks are disabled to remove any idle power that would otherwise be present in the hardware component. As a result of shutting off workload W and disabling the clocks on the hardware component, the temperature of the hardware component may begin to drop. As the temperature drops, leakage power and temperature may be continuously measured, e.g., by analog thermal sensors coupled to the hardware component (since digital sensors will not function when clocks are shut off). The leakage power and temperature may be continuously measured until the temperature of the hardware component reaches a steady low point temperature $T_{low}$. In embodiments, current leakage, corresponding to leakage power, may be measured. In embodiments, the leakage power and temperature may be measured over a period of time that begins when the workload W and the clocks are discontinued. The leakage power and the temperature may be continuously measured at a particular sampling rate (St) in which the analog sensors are configured to measure the data. The rate of temperature drop (Mt) may be controlled by the fan speed $FS_{set}$, and may be adjusted so that Mt is less than St. In embodiments, a dataset of leakage power measurements at various temperature measurements and at time instances may be stored, and this dataset may be used to characterize and model leakage power for the hardware component. The measured temperatures and leakage power values at various points in time may be stored, e.g., in a table.

In embodiments, e.g., when analog thermal sensors are not present, and where only digital thermal sensors are present, a clock for the hardware component may continue to run, but at the lowest possible frequency in order for the digital thermal sensor to operate. Since the clock is running, a relatively small amount of idle clock power may be present. When measuring leakage power at various temperatures, this idle clock power is subtracted, so that the idle power from the clock does not interfere with the leakage power data.

At step 225, set points of $V_{set}$, $F_{set}$, $FS_{set}$ may be adjusted so that leakage power measurements may be obtained for higher values of $T_{high}$ and lower values of $T_{low}$. For example, to achieve a higher temperature for $T_{high}$, the fan speed $F_{set}$ may be reduced, $V_{set}$ may be increased, and/or $F_{set}$ may be increased. To achieve a lower temperature for $T_{low}$, the fan speed $F_{set}$ may be increased, $V_{set}$ may be reduced, and/or $F_{set}$ may be reduced. At step 205, the adjusted set points may be applied to the hardware component. At step 210, the workload W and the clocks may be run, and phase 1 and phase 2 may be repeated, at steps 215 and 220, to obtain leakage power measurements at a different $T_{high}$ or $T_{low}$. Set points may again be adjusted, at step 225, in order to again obtain leakage power measurements at different values of $T_{high}$ and $T_{low}$. In this way, leakage power measurements may be obtained for a wide range of temperatures. In embodiments, phase 1 may be repeated at the same set points so that leakage power measurements at the same range of temperatures can be averaged, e.g., "state-averaging."

FIG. 3 shows a block diagram for using leakage power characterization data for system level power and performance management. At step 310, post-silicon leakage power characterization may be performed, e.g., in accordance with process blocks shown in FIG. 2. From step 310, vital product data 315, such as leakage power tables identifying leakage power measurements at various temperatures, may be obtained. Vital product data 315 may be provided to an EPROM 320 of a system. EPROM 320 may communicate vital product data 315 to service processor 325 that implements power management policies for processors P1, P2, and P3. Service processor 325 may update/optimize power management algorithms and policies for processors P1, P2, and P3 based on vital product data 315, e.g., data relating to the post-silicon leakage power characterization for processors P1, P2, and P3. Since post-silicon leakage power data is obtained at a wide variety of temperatures as described herein, performance of P1, P2, and P3 may be better optimized in relation to when post-silicon leakage power data is missing at higher temperatures.

Figure 4A:
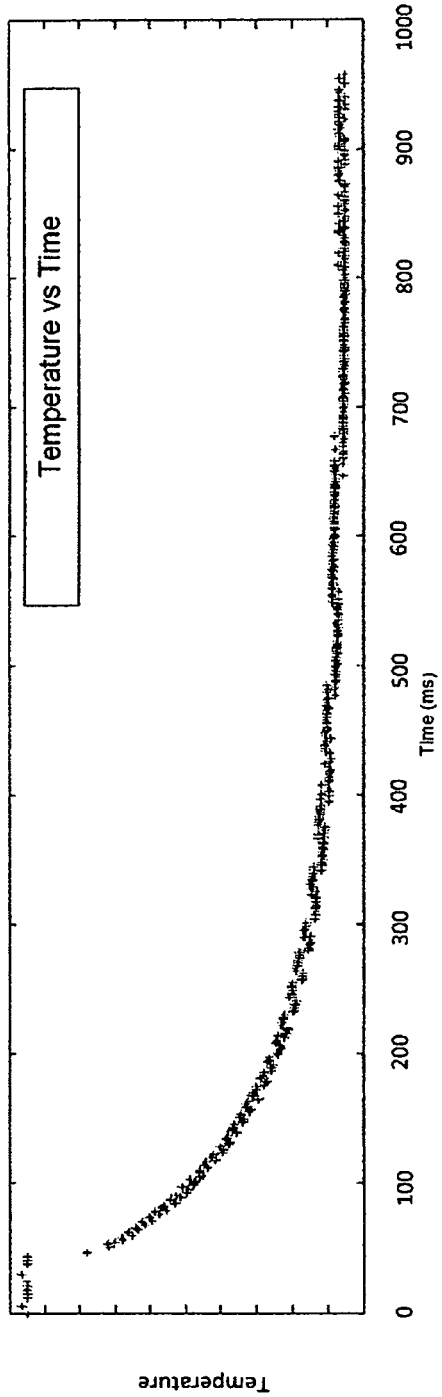
FIGS. 4A and 4B show graphs of temperature and leakage current measurements at different points in time in accordance with aspects of the present invention.
Figure 4B:
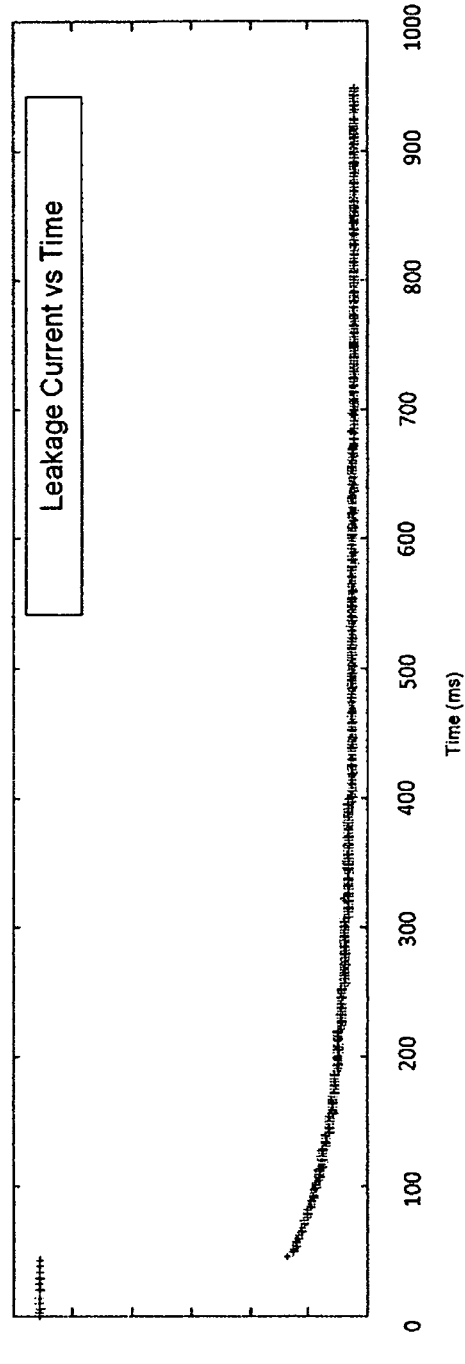

FIGS. 4A and 4B show graphs of temperature and leakage current measurements at different points in time. The graphs in FIGS. 4A and 4B may be based on temperature measurements and leakage current measurements gathered after a hardware component, e.g., a processor, has been preheated (as described in phase 1 of FIG. 2), and after a workload has been shut off (as described in phase 2 of FIG. 2). In embodiments, the graphs in FIGS. 4A and 4B may be based on temperature measurements and leakage current measurements that have been gathered after repetition of phase 1 and phase 2 as described in FIG. 2. As shown in FIG. 4A, temperature measurements are obtained over approximately 1000 milliseconds (ms). The range of the temperatures at which measurements are obtained are based on adjusting the $V_{set}$, $F_{set}$, and/or $FS_{set}$ values. By way of non-limiting example, the temperature may range from approximately 55° C. to approximately 95° C., although this temperature range can be varied for different embodiments. Referring to FIG. 4B, the leakage current (which may correspond to leakage power) over the approximately 1000 ms is graphed based on the leakage current measurements obtained in phase 2. In embodiments, leakage current at various temperatures may also be graphed, if desired. For example, the leakage current at temperature ranges of approximately 55° C. to approximately 95° C. (or other range of temperatures) may be graphed. The information from the graphs in FIGS. 4A and 4B may be output to an EPROM and used to optimize update/optimize power management algorithms and policies.

As described herein, leakage power characterization is performed in accordance with aspects of the present invention in a system environment, thereby enabling characterization or re-characterization at any point during the system product road map, e.g., as close as possible to the when the system is put into operation. Also, third party hardware components and integrated circuits used in the system can be easily characterized and revalidated. Further, leakage power data is obtained over a wide range of temperatures, thereby more accurately and fully completing a leakage power model to optimize power management algorithms and policies. Leakage power modeling can also be improved at corner conditions. Further, no elaborate hardware, hardware controls, or lab equipment is required. Also, only minimal knowledge of the architecture of the hardware component under test is required.

Figure 5:
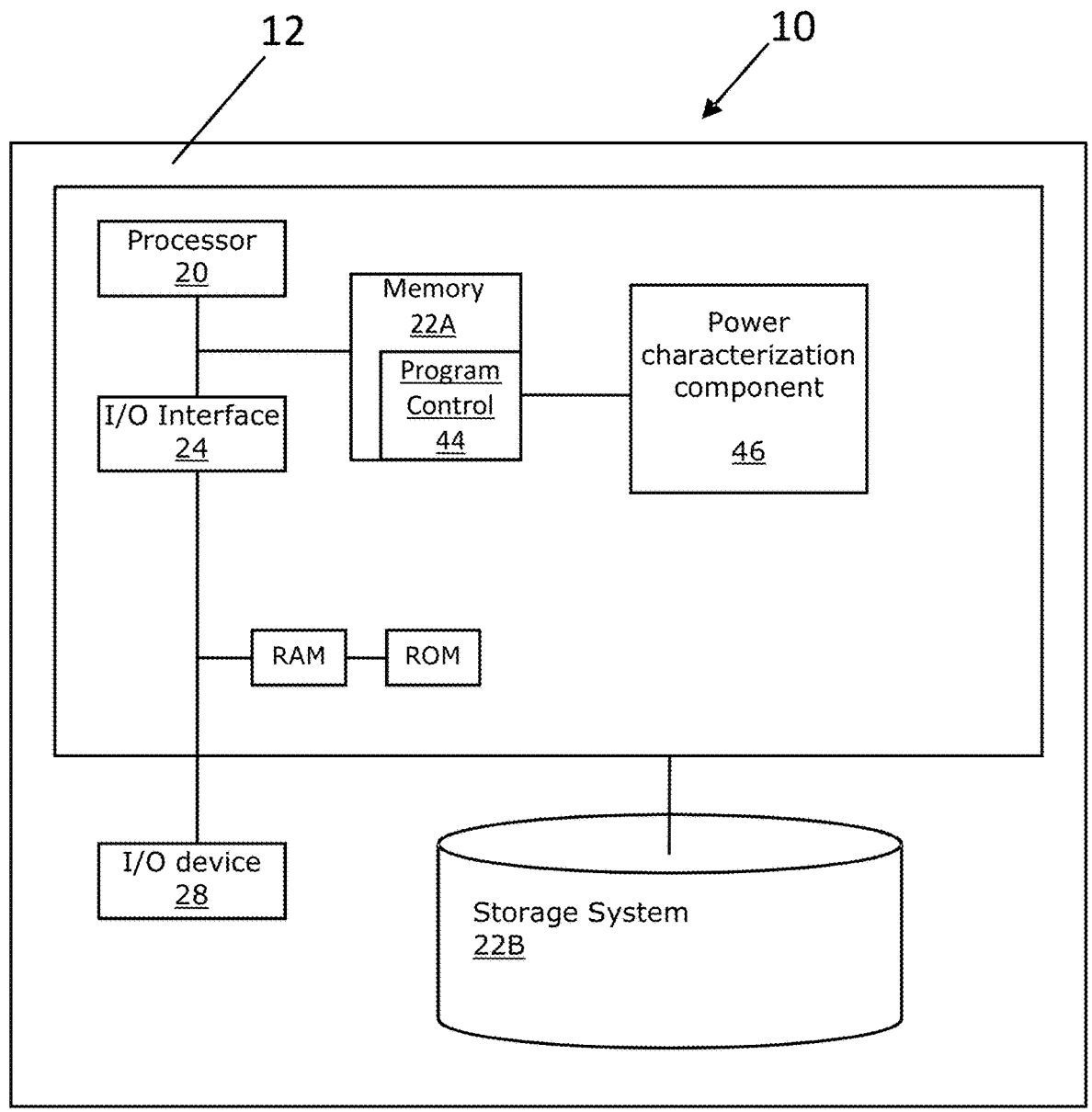
FIG. 5 shows an illustrative environment for implementing the steps in accordance with aspects of the invention in accordance with aspects of the present invention.

FIG. 5 shows an illustrative environment 10 for managing the processes in accordance with the invention. To this extent, environment 10 includes a server 12 or other computing system that can perform the processes described herein. In particular, server 12 includes a computing device 14. The computing device 14 can be resident on a network infrastructure or computing device of a third party service provider (any of which is generally represented in FIG. 3).

The computing device 14 includes a processor 20 e.g., CPU), memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 14 is in communication with external I/O device/resource 28 and storage system 22B. For example, I/O device 28 can comprise any device that enables an individual to interact with computing device 14 e.g., user interface) or any device that enables computing device 14 to communicate with one or more other computing devices using any type of communications link. The external I/O device/resource 28 may be for example, a handheld device, PDA, handset, keyboard etc.

In general, processor 20 executes computer program code e.g., program control 44), which can be stored in memory 22A and/or storage system 22B. Moreover, in accordance with aspects of the invention, program control 44 controls a power characterization component 46, e.g., the processes described herein. For example, power characterization component 46 can implement the processes shown of FIGS. 1-3. The power characterization component 46 can be implemented as one or more program code in program control 44 stored in memory 22A as separate or combined modules. Additionally, the error correcting component 46 may be implemented as separate dedicated processors or a single or several processors to provide the function of these tools. While executing the computer program code, the processor 20 can read and/or write data to/from memory 22A, storage system 22B, and/or I/O interface 24. Storage system 22B can include information associated power/current leakage measurements as described herein. In embodiments, memory 22A and/or storage system 22B may include an EPROM, which may store information relating to leakage power tables. The program code executes the processes of the invention, which can be provided as a computer program product stored on the computer readable storage medium. The bus 26 provides a communications link between each of the components in computing device 14.

The computing device 14 can comprise any general purpose computing article of manufacture capable of executing computer program code installed thereon e.g., a personal computer, server, etc.). However, it is understood that computing device 14 is only representative of various possible equivalent-computing devices that may perform the processes described herein. To this extent, in embodiments, the functionality provided by computing device 14 can be implemented by a computing article of manufacture that includes any combination of general and/or specific purpose hardware and/or computer program code. In each embodiment, the program code and hardware can be created using standard programming and engineering techniques, respectively.

Similarly, server 12 is only illustrative of various types of computer infrastructures for implementing the invention. For example, in embodiments, server 12 comprises two or more computing devices e.g., a server cluster) that communicate over any type of communications link, such as a network, a shared memory, or the like, to perform the process described herein. Further, while performing the processes described herein, one or more computing devices on server 12 can communicate with one or more other computing devices external to server 12 using any type of communications link. The communications link can comprise any combination of wired and/or wireless links; any combination of one or more types of networks e.g., the Internet, a wide area network, a local area network, a virtual private network, etc.); and/or utilize any combination of transmission techniques and protocols.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
   setting a cooling capacity of a cooling device for a hardware component;
   running a workload on the hardware component after setting the cooling capacity;
   discontinuing the workload and discontinuing clocks of the hardware component after a temperature of the hardware component has reached a steady high point;
   continuously measuring temperature and leakage power of the hardware component after discontinuing the workload until the temperature of the hardware component has reached a steady low point;
   modeling, by a computing device, leakage power for the hardware component based on the temperature and leakage power measurements;
   outputting, by the computing device, data relating to the temperature and leakage power measurements to an erasable programmable read only memory (EPROM); and
   adjusting, by the computing device and based on outputting the data relating to the temperature and leakage power measurements to the EPROM, a power management procedure, for the hardware component.

2. The method of claim 1, further comprising storing the data related to the temperature and leakage power measurements.

3. The method of claim 1, further comprising adjusting, based on outputting the data relating to the temperature and leakage power measurements to the EPROM, a power management procedure, for the hardware component.

4. The method of claim 1, wherein the hardware component is a post-silicon or post-manufacture hardware component.

5. The method of claim 1, wherein the hardware component is a processor.

6. The method of claim 1, further comprising disabling a power gating process prior to setting the cooling capacity.

7. The method of claim 1, further comprising:
   adjusting the cooling capacity after continuously measuring the temperature and current leakage of the hardware component;
   resuming the workload after adjusting the cooling capacity;
   discontinuing the workload and clocks of the hardware component after the temperature of the hardware component has reached a different steady high point; and
   re-measuring the temperature and leakage power of the hardware component.

8. The method of claim 1, wherein the cooling device is a fan or water cooling device.

9. The method of claim 1, wherein continuously measuring the temperature includes measuring the temperature using a digital thermal sensor, wherein measuring the leakage power includes subtracting idle clock power from a clock used to run the digital thermal sensor.

10. A method comprising:
    preheating a hardware component;
    discontinuing preheating the hardware component;
    obtaining temperature and the leakage power measurements by continuously measuring temperature and leakage power of the hardware component after discontinuing the preheating;
    modeling, by a computing device, leakage power for the hardware component based on the temperature and leakage power measurements; and
    outputting, by the computing device, data relating to the temperature and leakage power measurements to an erasable programmable read only memory (EPROM).

11. The method of claim 10, wherein the preheating includes:
    setting a rail voltage, a frequency, and a fan speed for the hardware component; and
    running a workload on the hardware component after setting the rail voltage, the frequency, and the fan speed.

12. The method of claim 11, wherein the discontinuing the preheating includes discontinuing the workload after the temperature of the hardware component has reached a steady high point.

13. The method of claim 10, further comprising adjusting a power management policy for the hardware component based on continuously measuring the temperature and the leakage power of the hardware component.

14. The method of claim 10, wherein the hardware component is a processor.

15. The method of claim 10, further comprising disabling a power gating process prior to preheating the hardware component.

16. The method of claim 10, further comprising disabling clocks associated with the hardware component, wherein measuring the temperature includes measuring the temperature using an analog thermal sensor.

17. The method of claim 10, wherein continuously measuring the temperature includes measuring the temperature using a digital thermal sensor, wherein measuring the leakage power includes subtracting idle power from a clock used to run the digital thermal sensor.

18. A system configured to:
    apply a rail voltage to a hardware component;
    cause a cooling device, coupled to the hardware component, to operate at a cooling capacity;
    run a workload on the hardware component after applying the rail voltage and causing the cooling device to operate at a particular cooling capacity;
    discontinue the workload and discontinue clocks of the hardware component after a temperature of the hardware component has reached a first point;
    continuously measure temperature and leakage power of the hardware component after discontinuing the workload until the temperature of the hardware component has reached a second point; and adjust a power management procedure for the hardware component based on measured temperature and measured leakage power of the hardware component.

19. The system of claim 18, wherein the hardware component is a processor.

20. The system of claim 18 further configured to:
after continuously measuring the temperature and current leakage of the hardware component until the temperature of the hardware component has reached the second point:
  apply a different rail voltage to the hardware component, or
  cause the cooling device, coupled to the hardware component, to operate at a different cooling capacity;
resume the workload after applying the different rail voltage to the hardware component or causing the cooling device to operate at the different cooling capacity;
discontinue the workload and the clocks of the hardware component after the temperature of the hardware component has reached a different first point; and
re-measure the temperature and leakage power of the hardware component after discontinuing the workload and the clocks of the hardware component after the temperature of the hardware component has reached the different first point.

* * * * *